(12) United States Patent
Perkins et al.

(10) Patent No.: US 7,969,177 B2
(45) Date of Patent: Jun. 28, 2011

(54) SYSTEM AND METHOD FOR THERMAL LIMIT CONTROL

(75) Inventors: Philip Earle Perkins, Needham, MA (US); Stephen Frederick Limoges, Jr., Attleboro, MA (US); Xiaomin Yan, Norwood, MA (US); James William McGinley, Natick, MA (US); Roger Henry Therrien, Hanover, MA (US)

(73) Assignee: LTX—Credence Corporation, Norwood, MA (US)

( * ) Notice: Subject to any disclaimer, the term of this patent is extended or adjusted under 35 U.S.C. 154(b) by 208 days.

(21) Appl. No.: 12/341,162

(22) Filed: Dec. 22, 2008

(65) Prior Publication Data
US 2010/0156492 A1    Jun. 24, 2010

(51) Int. Cl.
*G01R 31/26* (2006.01)
(52) U.S. Cl. .......................................... 324/765
(58) Field of Classification Search .................. 324/765, 324/158.1, 76.15, 76, 24, 38, 115; 345/134, 345/440, 348; 702/67, 69, 108
See application file for complete search history.

(56) References Cited

U.S. PATENT DOCUMENTS

| 4,246,529 | A |  | 1/1981 | Jurgens et al. |
| 4,387,334 | A |  | 6/1983 | Loper |
| 4,484,130 | A |  | 11/1984 | Lowndes et al. |
| 4,677,363 | A |  | 6/1987 | Kopmann |
| 4,775,827 | A |  | 10/1988 | Ijntema et al. |
| 4,820,966 | A |  | 4/1989 | Fridman |
| 5,012,176 | A |  | 4/1991 | LaForge |
| 5,043,651 | A |  | 8/1991 | Tamura |
| 5,325,041 | A |  | 6/1994 | Briggs |
| 5,691,635 | A | * | 11/1997 | Pot et al. ..................... 324/115 |
| 6,515,484 | B1 | * | 2/2003 | Bald et al. .................... 324/551 |

* cited by examiner

*Primary Examiner* — Ha Tran T Nguyen
*Assistant Examiner* — Tung X Nguyen
(74) *Attorney, Agent, or Firm* — Holland & Knight LLP; Brian J Colandreo, Esq.; Mark H Whittenberger, Esq.

(57) ABSTRACT

This disclosure relates to a system and method for pulse generation. A system in accordance with the present disclosure may include a power dissipating element configured to receive power from a power source. At least one of the power source and the power dissipating element may be configured to generate a first signal. The system may further include a measuring instrument in communication with the power source. The measuring instrument may be configured to measure the first signal and to provide an input corresponding to a measured signal to a duty cycle limiter. The system may also include a pulse controller operatively connected to the power source. The pulse controller may be configured to control a duty cycle of the first signal and to receive a second signal from the duty cycle limiter. The pulse controller may be configured to disable at least one of the power source and the power dissipating element if the duty cycle limiter has determined that a maximum condition has been exceeded. Other embodiments are also within the scope of the present disclosure.

20 Claims, 8 Drawing Sheets

400

500

SYSTEM AND METHOD FOR THERMAL LIMIT CONTROL

TECHNICAL FIELD

This disclosure relates to temperature control of a pulsing system and, more particularly, to thermal limit control using a duty cycle limiter.

BACKGROUND

High power output stages of electronic systems may source or sink high currents and generate a large amount of heat as a by-product. A variety of different techniques have been employed to keep the operating temperature of electronic devices within an acceptable range. For example, some systems may use heat sinks on the power components or may supply additional air flow in an effort to decrease the temperature. If the power component exceeds its acceptable operating range the power component may become thermally overstressed, a situation that may lead to significant premature failures or, in some cases, an immediate failure.

Generally, before an electronic device (e.g., an integrated circuit (IC)) is deemed satisfactory, the device is subjected to substantial testing. In some cases, this testing may involve the injection of a voltage or current into the device under test followed by various measurements. For example, an automated test system may be used, which may incorporate a VI (voltage, current) instrument to force a voltage or current into the DUT. Typically, an automated testing system will operate in one of two modes, continuous or pulsed.

In the continuous mode, the automated testing system may be configured to provide a specific current for an indefinite period of time. For example, the automated testing system may be programmed to provide 1.5 Amperes (A) continuously, while still operating within the acceptable temperature range of the output stage. In some cases, pre-loaded tables stored within the automated testing system may set the safe operating conditions and limit the output to an acceptable level.

In the pulsed mode, the amount of heat generated by the output stage of the VI instrument is a function of the on and off times of the output stage. The longer the on time, the higher the temperature of the output stage. For example, a 5.0 A pulse could be applied for a 20% on time (On=20 ms/Off=80 ms) and the temperature of the output stage may be maintained within the acceptable operational range.

In the testing environment, the duration of a particular test is often an important consideration. As programmers of automated test systems strive to reduce device test time, the output power and on and off times of the VI instrument must be observed to ensure that the output stage is not stressed beyond its thermal limit.

Traditionally, one method used to monitor the temperature of the output stage of the VI instrument involved the use of thermocouples and/or thermistors to measure the actual temperature of the instrument. However, this approach has not always yielded sufficiently accurate results as the generated heat has a thermal lag and will continue to rise even when the VI instrument is turned off to cool. This may lead to excessive temperature.

One approach that has been used to approximate output stage temperature may utilize a counter to keep track of the time that the output stage is enabled. In this example, the counter may increment whenever the gate for the output stage is enabled (i.e., Gate On) and may automatically disable the output stage (i.e., Gate Off) if the count is exceeded. In this case, the output stage may be turned off to allow for cooling and in some cases ruin the test being performed.

To prevent an over temperature condition, the VI instrument may be programmed to stay within the specified on time for the current being applied and implement forced waits to allow for cooling of the output device. For example, a 1 A pulse may be applied for an on time of 20 ms with an off time of 80 ms yielding a 20% on time. Repeating this test 10 times would take approximately 1000 ms of test time.

This approach may yield an inaccurate approximation of the VI instrument temperature as the counter may begin incrementing whenever the gate for the output stage is turned on, regardless of whether the load was drawing any power. The VI instruments used in automatic test equipment are often used as loads for the DUT and may not draw power continuously during the test. This may produce a false thermal approximation since the output stage only heats up when current is being drawn.

Further, this approach may lead to inefficient test programs requiring longer test times. That is, forced wait states may need to be implemented to allow for cooling in order to maintain a maximum on time percentage (i.e., 20%) without accounting for the actual current drawn. Moreover, reaching the counter limit may force a Gate Off condition that removes power from the DUT and invalidates the electrical verification process.

As such, existing testing methodologies provide an over conservative estimation of the thermal profile of the output stage of a VI instrument. A system configured to make a more accurate approximation of output stage temperature and produce a longer on time, which may reduce the total amount of test time required.

SUMMARY OF THE DISCLOSURE

In a first embodiment, a testing system is provided. The testing system may include a voltage/current (VI) instrument having a power amplifier configured to generate a first signal of at least one of a voltage and a current. The VI instrument may be further configured to transmit the first signal to a device-under-test (DUT) and to perform a real-time measurement of the first signal to determine an ON-time and an OFF-time of the first signal. The VI instrument may be further configured to disable the power amplifier if a maximum allowable ON-time of the power amplifier is exceeded.

In accordance with some embodiments, one or more of the following features may be included. The ON-time and OFF-time may be measured by a counter, which may be configured to increment during the ON-time and decrement during the OFF-time. Further, the VI instrument may be further configured to disable the power amplifier if a maximum allowable ON-time to OFF-time duty cycle of the power amplifier is exceeded. The maximum allowable ON-time and a maximum allowable ON-time to OFF-time duty cycle of the power amplifier may be adjusted in real-time.

In some embodiments, the VI instrument may be further configured to provide an indication of an available ON-time before the maximum allowable ON-time is reached. The VI instrument may be further configured to change the maximum allowable ON-time and a maximum allowable ON-time to OFF time duty cycle in response to at least one of a measured voltage and a measured current. The VI instrument may be further configured to allow the power amplifier to be re-enabled from a disabled state and to apply at least one of the maximum allowable ON-time and a maximum allowable ON-time to OFF-time duty cycle.

In another embodiment, a method for analyzing a voltage/current (VI) instrument is provided. The method may include generating a first signal of at least one of a voltage and a current and transmitting the first signal to a device-under-test (DUT). The method may also include performing a real-time measurement of the first signal to determine an ON-time and an OFF-time of the first signal and disabling the power amplifier if a maximum allowable ON-time of said power amplifier is exceeded.

In some embodiments, one or more of the following features may be included. The method may further include measuring the ON-time and OFF-time by a counter, the counter configured to increment during the ON-time and decrement during the OFF-time. The method may also include disabling the power amplifier if a maximum allowable ON-time to OFF-time duty cycle of the power amplifier is exceeded. The method may additionally include adjusting, in real-time, at least one of the maximum allowable ON-time and a maximum allowable ON-time to OFF-time duty cycle of the power amplifier.

In some embodiments, the method may further include providing an indication of an available ON-time before the maximum allowable ON-time is reached. The method may also include changing the maximum allowable ON-time and a maximum allowable ON-time to OFF time duty cycle in response to at least one of a measured voltage and a measured current. The method may further include allowing the power amplifier to be re-enabled from a disabled state and to apply at least one of the maximum allowable ON-time and a maximum allowable ON-time to OFF-time duty cycle.

In yet another embodiment, a pulsing system is provided. The pulsing system may include a power dissipating element configured to receive power from a power source. At least one of the power source and the power dissipating element may be configured to generate a first signal. The pulsing system may further include at least one measuring instrument in communication with the at least one power source. The at least one measuring instrument may be configured to measure the first signal and to provide an input corresponding to a measured signal to a duty cycle limiter. The pulsing system may additionally include a pulse controller operatively connected to the at least one power source. The pulse controller may be configured to control a duty cycle of the first signal and to receive a second signal from the duty cycle limiter. The pulse controller may also be configured to disable at least one of the power source and the power dissipating element if the duty cycle limiter has determined that a maximum condition has been exceeded.

In some embodiments, one or more of the following features may be provided. For example, the pulse controller may generate a variable pulsing operation. The pulsing system may be associated with a device selected from the group consisting of a power tool and a power semiconductor device tester. Of course, numerous other applications are also within the scope of the present disclosure.

Alternatively, the pulse controller may generate a fixed pulsing operation. For example, the pulsing system may be associated with a fault protection function. The maximum limit may be at least one of a maximum allowable ON-time and a maximum allowable duty cycle.

The details of one or more embodiments are set forth in the accompanying drawings and the description below. Other features and advantages will become apparent from the description, the drawings, and the claims.

DETAILED DESCRIPTION OF THE DISCLOSURE

Figure 1:
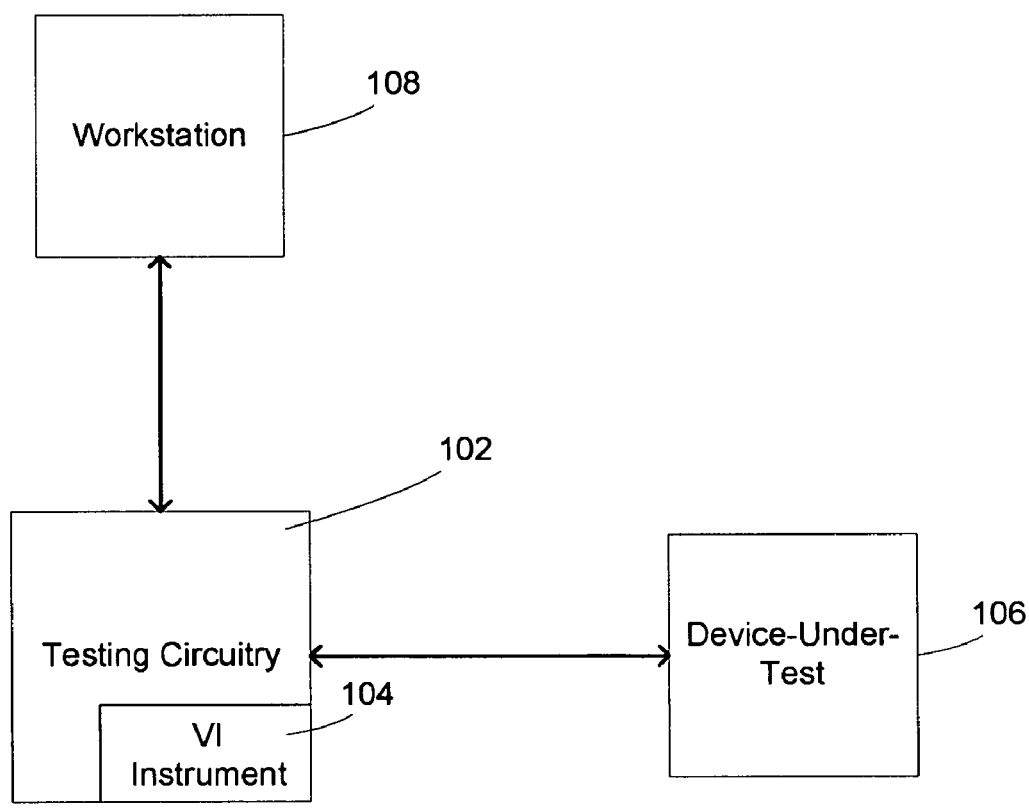
FIG. 1 is a block diagram of a testing system in accordance with an embodiment of the present disclosure.

Referring to FIG. 1, a testing system 100 including testing circuitry 102 having voltage/current (VI) instrument 104 is shown. Testing circuitry 102 may be coupled to device-under-test (DUT) 106, and at least one workstation 108. In some embodiments, testing circuitry 102 may be configured to perform testing upon a number of different devices configured for a variety of applications. Some of these applications may include, but are not limited to, wireless radio frequency (RF), automotive, power management, baseband communications, datacomm, digital-to-analog and analog-to-digital converters. The DUT may be an integrated circuit (IC) and/or any other type of electrical circuitry.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or embodiment herein may be implemented in software, firmware, hardwired circuitry and/or any combination thereof.

In some embodiments, testing circuitry 102 may be modular in design and may include a mainframe rack configured to store a number of mountable units. The mainframe rack may be configured to hold various system components, such as VI instrument 104. Testing circuitry 102 may be configured to test electrical components having a wide variety of pins and pin arrangements. Testing circuitry 102 may also include a cooling system configured to provide forced air-cooling to the components housed within testing circuitry 102.

Testing circuitry 102 may be coupled to at least one workstation, e.g. workstation 108, which may be included within part of a larger network. This network may contain any number of workstations, memory devices and/or other testing systems. Each workstation may include a testing controller configured to generate test programs, databases and to execute various commands. Once a testing program has been created and debugged, it may be downloaded from a memory device into system 100 for execution.

Workstation 108 may include a central processing unit (CPU) having a memory as well as numerous connections (e.g., monitor, keyboard, mouse, etc.). The testing controller at each workstation may be used to assign test programs to a particular testing system as well as to monitor and execute diagnostic and calibration programs. In some embodiments, the testing controller may include a UNIX Sun Blade 150 or Blade 2500, or a Dell 380N PC running Linux.

The term "memory" as described herein, may refer to semiconductor firmware memory, programmable memory, non-volatile memory, read only memory, electrically programmable memory, random access memory, flash memory, magnetic disk memory, and/or optical disk memory. Other types of memory are also within the scope of the present disclosure.

Testing circuitry 102 may also include Peripheral Component Interface (PCI) cards for use with a testing controller. For example, a high speed serial (HSS) PCI card may communicate with a Source Synchronous StepBus (SSBI) card. The SSBI may communicate with a Source Synchronous StepBus Adapter (SSBA) card in testing circuitry 102. The term "card" as used herein may refer to a printed circuit board (PCB) or any device having circuitry associated therewith.

Testing circuitry 102 may also include a card cage configured to house each of the cards described herein. The card cage may be constructed in a number of different arrangements, e.g., as a metal-box housing having plastic guides to align and seat the individual cards. The card cage may be secured to the backplane to ensure proper fully seated connections between the circuit boards and their corresponding slot connectors. Testing circuitry 102 may further include a reference clock (e.g., 10 MHz) and a synchronous digital bus (SyncBus), which may be physically located on the testhead backplane and wired to all of the PCB slots. The SyncBus may be configured to provide a means for multiple devices to operate in a synchronous fashion and to allow one device or the CPU to trigger or gate the operation of one or more devices.

Testing circuitry 102 may further include a power supply configured to force a current (I) or voltage (V) to DUT 106. In some embodiments, the power supply may include a number of channels configured to force and/or measure voltage and/or current. One example of a power supply that may be used in accordance with the present disclosure is VI instrument 104, which is described in further detail hereinbelow.

In some embodiments, VI instrument 104 may operate as a high voltage, high current floating power supply, which may be used in a variety of different applications. VI instrument 104 may be configured to operate in either a continuous (e.g., 1.5 A) or pulsed (e.g., 5 A) power mode.

VI instrument 104 may include a number of power supplies that may be used to construct higher voltage and/or current sources. For example, four power supplies may be used in series to generate up to ±240V at up to ±5 A between its positive and negative outputs in force voltage mode, or to generate up to ±5 A at up to ±240V in force current mode. The four supplies may also be used in parallel for applications up to ±60V and up to 20 A in force voltage mode, or force current mode. In addition to voltage and current generation, VI instrument 104 may also be configured to measure both voltage (e.g., 1-60V) and current (e.g., 5 µA-5 A).

Figure 2:
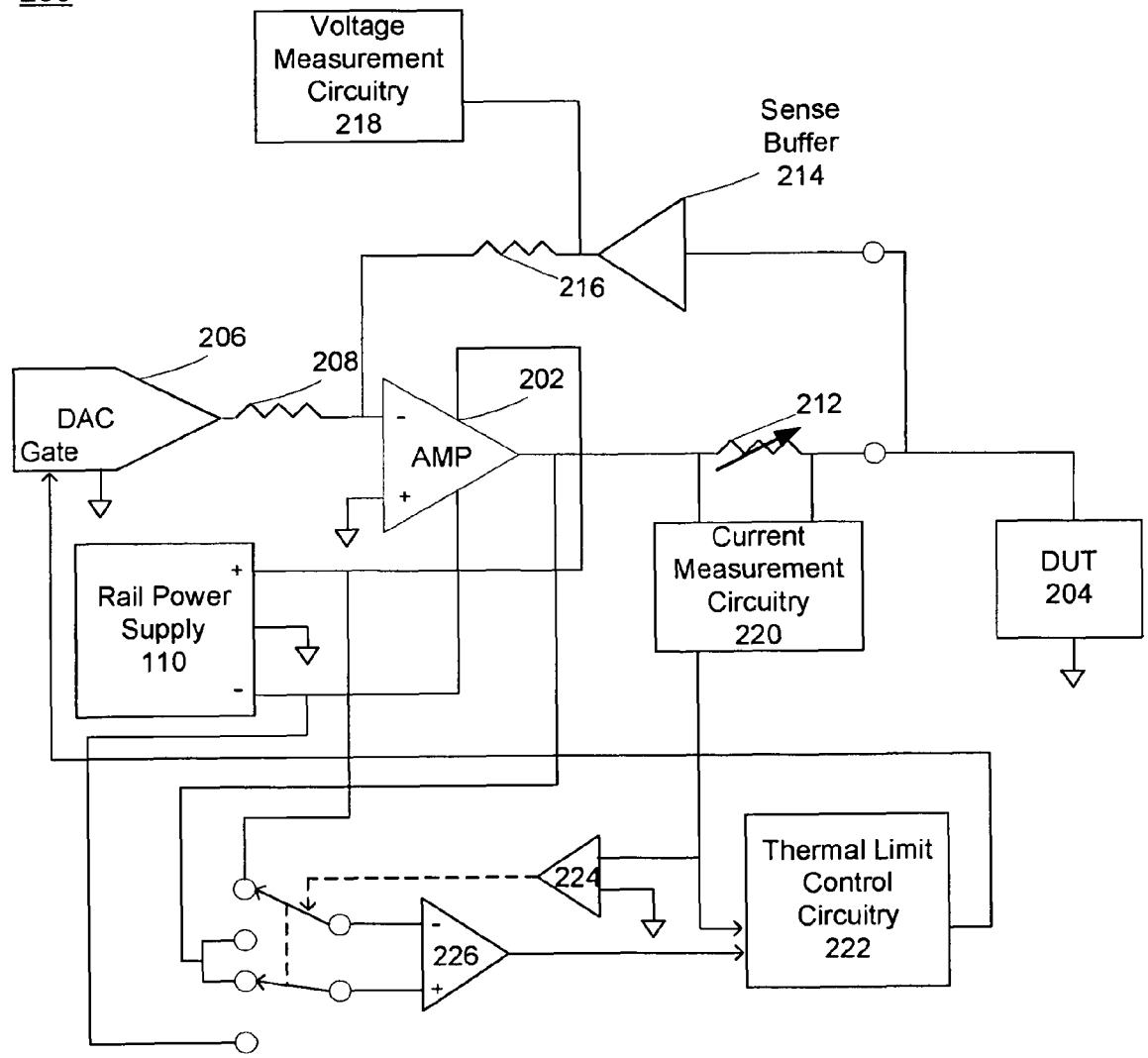
FIG. 2 is a block diagram showing a voltage/current (VI) instrument in accordance with an embodiment of the present disclosure.

Referring now to FIG. 2, one example of a VI instrument 200 is shown. It should be noted that portions of VI instrument 200 may be included within a variety of different devices. These devices may include but are not limited to, complex programmable logic devices (CPLD), field programmable gate arrays (FPGA), and application specific integrated circuits (ASIC).

In some embodiments, VI instrument 200 may include power amplifier 202 configured to generate (902) and force a first signal to DUT 204 and to subsequently transmit the generated signal to DUT 204 (904). The first signal may be a voltage or current signal. Power amplifier 202 may receive a signal from a digital-to-analog converter (DAC) 206, which may be configured to convert between digital and analog signals. The output of DAC 206 may be provided to power amplifier 202 through first input resistor 208. In one example, DAC 206 may be programmed to an opposite polarity voltage proportional to the desired output voltage.

VI instrument 200 may be configured to perform a real-time measurement of the first signal to determine and ON-time and an OFF-time of the first signal (906). Moreover, VI instrument 200 may also be configured to disable power amplifier 202 if a maximum allowable ON-time of power amplifier 202 is exceeded (908). Power amplifier 202 may also be disabled if a maximum allowable ON-time to OFF-time duty cycle of power amplifier 202 is exceeded. These operations are described below in greater detail.

VI instrument 200 may include a feedback loop, which may include power amplifier 202, ammeter resistor 212, sense buffer 214, input resistor 208, and feedback resistor 216. Power amplifier 202 may receive power from rail power supply 210. Power amplifier 202 may be configured to force an output voltage represented by the following equation:

$$V_{output} = V_{DAC}(-R2/R1) \qquad \text{Equation (1)}$$

Where $V_{output}$ represents the output of power amplifier 202, $V_{DAC}$ represents the voltage at DAC 206, R1 represents the resistance of first input resistor 208, and R2 represents the resistance of feedback resistor 216. The output of power amplifier 202 may be measured by voltage measurement circuitry 218, which may measure the output signal of sense buffer 214.

In some embodiments, power amplifier 202 may force a signal to current measurement circuitry 220. Current measurement circuitry may be operatively connected with thermal limit control circuitry 222, and may be configured to measure the ON-time and OFF-time of the signal received from power amplifier 202. Thermal limit control circuitry 222 may also include a duty cycle limiter, which is described in greater detail below.

As discussed above, current measurement circuitry 220 may include, or may operate in conjunction with a number of different components, including, but not limited to, an ammeter resistor 212. Current measurement circuitry 220 may be configured to measure the output current from power amplifier 202 by determining the voltage drop across ammeter resistor 212. When delivering positive current, power amplifier 202 may dissipate power approximately equal to the positive rail voltage minus the power amplifier output voltage ($V_{output}$). Alternatively, when delivering negative current, power amplifier 202 may dissipate power approximately equal to $V_{output}$ minus the negative rail voltage.

In the past, a gate ON command has been used to trigger a temperature limiting system for a particular VI instrument. However, the device-under-test may not be actually drawing power until commanded to do so through other circuitry. Thus, the delay between the gate ON program and the actual transfer of power may be significant, which may lead to false ON-time readings. This may force wait states to be added in order to remain within acceptable duty cycles. Moreover, in order to maintain the ON-time within an acceptable range, prior VI instruments had a predetermined power OFF time for every power ON time. As such, longer test programs are required, which may result in inefficient testing.

In contrast, VI instrument 200 may be configured to approximate the thermal profile of power amplifier 202 by detecting when current is actually drawn by DUT 106, 204 and not merely when the gate is on. VI instrument 200 of the present disclosure may incorporate current measurement circuitry 220 to provide a more accurate representation of the power that is actually being drawn by DUT 204. VI instrument 200 may also be configured to determine an available "credit" (i.e., unused On-time) based upon the difference between the actual ON-time of power amplifier 202 and a maximum allowable ON-time of power amplifier 202. VI instrument 200 may be further configured to adjust, in real-time, the maximum allowable ON-time and/or the maximum allowable ON-time to OFF-time duty cycle of power amplifier 202. In some embodiments, this may be done in response to a measured voltage and/or a measured current from at least one of voltage measurement circuitry 218 and/or current measurement circuitry 220.

As discussed above, the maximum allowable ON-time may be based upon the existing thermal limits associated with power amplifier 202. For example, an active region safe operating graph (e.g., a plot of the collector emitter voltage vs. the collector current) may be used to determine the maximum allowable ON-time for a particular power amplifier.

VI instrument 200 may include thermal limit control circuitry 222 configured to receive a measurement signal from current measurement circuitry 220. Current measurement circuitry 220 may also provide an input to comparator 224, which may be configured to monitor the polarity of the output current of power amplifier 202 and select an appropriate voltage for differential amplifier 226 to monitor. Differential amplifier 226 may be configured to monitor the voltage drop across the part of the power amplifier 202 that dissipates the majority of the power. The output of differential amplifier 226 may then be provided to thermal limit control circuitry 222, which may be configured to monitor the power amplifier output current and the voltage drop across power amplifier 202. Thermal limit control circuitry 222 may also be configured to determine the presence of at least one "heating up" region. Using this determination, thermal limit control circuitry 222 may be configured to gate off the voltage source if the maximum allowable ON-time for power amplifier 202 is exceeded. Thermal limit control circuitry 222 may be configured to disable power amplifier 202 if a maximum allowable ON-time and/or a maximum allowable ON-time to OFF-time duty cycle is exceeded. A more detailed explanation of the thermal limit control capability of the present disclosure is provided below.

Figure 3:
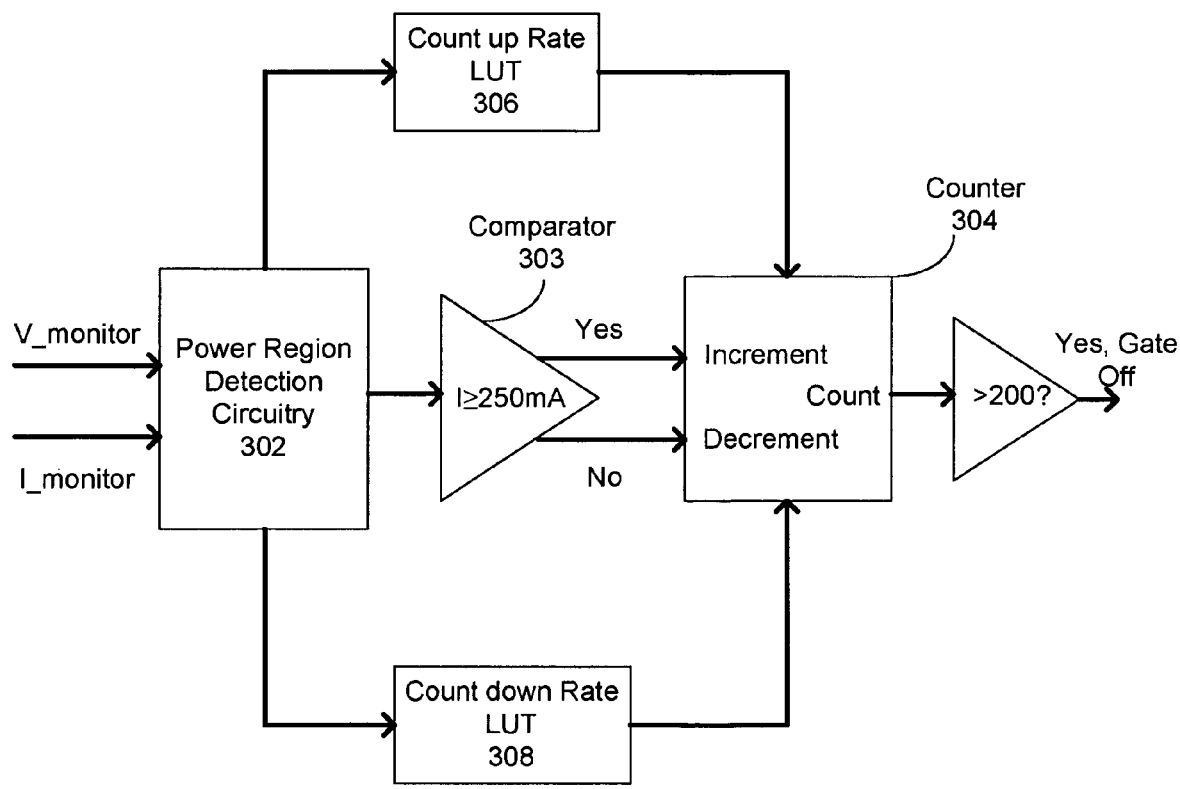
FIG. 3 is a diagram showing an example of thermal limit control in accordance with an embodiment of the present disclosure.

Referring now to FIG. 3 a diagram depicting one embodiment of thermal limit control circuitry 300 in accordance with the present disclosure is provided. Thermal limit control circuitry 300 may be configured to monitor the ON-time of power amplifier 202 as applied to the DUT (e.g., 106, 204). Depending upon the particular voltage and current, there may be a number of heating up regions when the current is above a certain level. In the example provided below there may be 20 heat up regions when the current is above 0.25 A. Alternatively, power amplifier 202 may be considered to be in the cool off region when the current is lower than 0.25 A. Of course, other current settings may be employed and any number of regions may be used.

Thermal limit control circuitry 300 may include power region detection circuitry 302, which may be configured to receive signals from current measurement circuitry 220 and differential amplifier 226. Power region detection circuitry 302 may be coupled with comparator 303, which may be in communication with a counter 304, which may be configured to increment when power amplifier 202 is in a heat up region (910). Power region detection circuitry 302 and counter 304 may have access to a count up look-up table (LUT) 306 and a count down look-up table (LUT) 308. Table 1 shown below indicates one possible example of a count-up LUT showing the incremental rate for each heat-up region.

TABLE 1

| Count Up Rate Look-Up Table when I > 250 mA | | | | |
|---|---|---|---|---|
| | Current | | | |
| Voltage | 5 A-3 A | 3 A-1.5 A | 1.5 A-0.75 A | 0.75 A-0.25 A |
| 34-71 | 2.5 μs | 17 μs | 35 μs | 171 μs |
| 22-34 | 44 μs | 70 μs | 200 μs | 800 μs |
| 17-22 | 70 μs | 133 μs | 400 μs | 200 μs |
| 10-17 | 100 μs | 200 μs | 800 μs | 200 μs |
| 5-10 | 200 μs | 489 μs | 200 μs | 200 μs |

When the current is lower than 0.25 A, power amplifier 202 is in the cool off region and counter 304 may begin to decrement. In some cases, the decrement rate may be dependent upon the immediately previous heat up region. Table 2 shown below indicates one possible example of the decrement rate for each heat up region.

TABLE 2

| Count Down Rate Look-Up Table when I < 250 mA (Table is based upon immediately previous region. The previous region voltages and currents are listed). | | | | |
|---|---|---|---|---|
| | Current | | | |
| Voltage | 5 A-3 A | 3 A-1.5 A | 1.5 A-0.75 A | 0.75 A-0.25 A |
| 34-71 | 50 μs | 200 μs | 200 μs | 400 μs |
| 22-34 | 400 μs | 400 μs | 400 μs | 400 μs |
| 17-22 | 400 μs | 400 μs | 400 μs | 400 μs |
| 10-17 | 400 μs | 400 μs | 400 μs | 400 μs |
| 5-10 | 400 μs | 400 μs | 400 μs | 400 μs |

Counter 304 may be configured to count up to a set limit (e.g. 200). This limit may indicate the maximum allowable ON-time of power amplifier 202. In other words, when this limit is exceeded VI instrument 200 may have exceeded the hottest point where it can work reliably. In this case, VI instrument 200 may gate off the power amplifier and an error flag may be set. The power amplifier may be gated on again once the error flag is cleared and counter 304 is lower than its highest limit, in this example 200.

In some embodiments, VI instrument 200 may operate in a continuous mode. For example, referring again to Table 1, for the three regions where the current is between approximately 0.25 A-0.75 A and the voltage is between approximately 0-22V, and the one region where the current is between approximately 0.75 A-1.5 A and the voltage is between approximately 0-10V, the VI instrument is operating in a continuous mode. When counter 304 reaches this limit, it will not increment any further, but may remain constant.

For all other regions, VI instrument 200 may operate in a pulse mode. Counter 304 may continue incrementing even if it reaches the limit. Here, the limit may be exceeded resulting in a gate off. VI instrument 200 may change from one heat up region to another and counter 304 will increment at the corresponding rate. As long as counter 304 does not exceed the limit, there is no forced gate off.

Figure 4A:
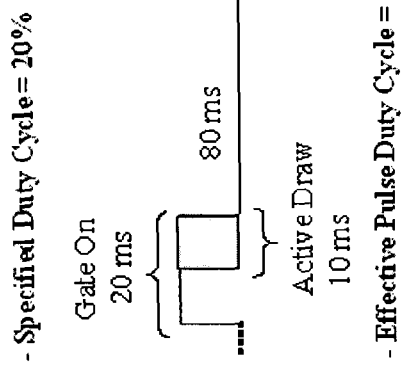
FIG. 4A is a diagram showing the duty cycle of a previous temperature monitoring system.
Figure 4B:
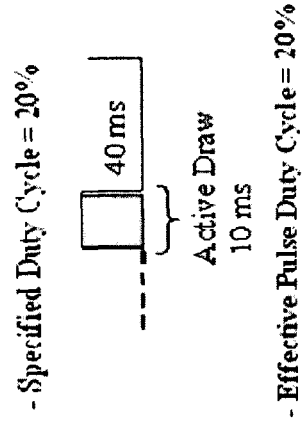
FIG. 4B is a diagram showing the duty cycle of a temperature monitoring system in accordance with an embodiment of the present disclosure.

Referring now to FIGS. 4A and 4B, diagrams comparing an existing technique and a diagram consistent with an embodiment of the present disclosure are shown. In the example shown in FIG. 4A, the Gate On trigger mechanism starts the timer once the power amplifier is enabled. Here, the Gate is On for 20 ms. However, if the device-under-test draws power for only 10 ms, then there is wasted efficiency as the effective pulse ON-time is only 10 ms, despite being specified for 20 ms. In contrast, in FIG. 4B the timer may be enabled only when current is drawn as is described herein. Thus, a true reading of the ON-time is provided and efficiency is improved. In this example, a 20 ms specified ON-time may result in a 20 ms effective ON-time.

may not start counting up until the current exceeds 250 mA. Currents below 250 mA may cause the thermal integration to count back to cool-down.

When using automatic rail settings in force current (FI) mode, the software driver for VI instrument 200 may set the rail voltages based upon the user setting of the voltage clamps. The maximum pulse widths available may depend upon the difference between the voltage clamp settings and the actual voltage forced. Table 3, shown below, indicates the operation of VI instrument 100 in force current (FI) mode.

TABLE 3

| | | | High I | High I | High I | High I | Low I |
| ΔV | | | 5-3 A | 3-1.5 A | 1.5-0.75 A | 0.75-0.25 A | 0.25-0 A |
| --- | --- | --- | --- | --- | --- | --- | --- |
| 18.5 V < ΔV ≦ 56 V | | MaxOn | 500 µs | 3.4 ms | 7 ms | 34 ms | continuous |
| 18.5 V < ΔV ≦ 56 V | | MinOff | 10 ms | 40 ms | 40 ms | 80 ms | 80 ms |
| 7.5 V < ΔV ≦ 18.5 V | | MaxOn | 8.8 ms | 14 ms | 39 ms | 155 ms | continuous |
| 7.5 V < ΔV ≦ 18.5 V | | MinOff | 80 ms | 80 ms | 80 ms | 80 ms | 80 ms |
| 1.8 V < ΔV ≦ 7.5 V | | MaxOn | 14 ms | 26 ms | 80 ms | continuous | continuous |
| 1.8 V < ΔV ≦ 7.5 V | | MinOff | 80 ms | 80 ms | 80 ms | 80 ms | 80 ms |
| 0 V < ΔV ≦ 1.8 V | | MaxOn | 20 ms | 39 ms | 155 ms | continuous | continuous |
| 0 V < ΔV ≦ 1.8 V | | MinOff | 80 ms | 80 ms | 80 ms | 80 ms | 80 ms |

As described above, VI instrument 200 may also include a counter 304 configured to monitor when current is being drawn with respect to the allowable ON-time. The actual supply of power through DUT 204 and shunt resistor 212 may provide a trigger mechanism that may be used to increment counter 304 as DUT 204 is drawing current and decrement counter 304 whenever DUT 204 is not drawing power (e.g., being cooled). A programmable upper limit on the counter value may represent the maximum allowable ON-time for the current to flow and maintain operation within acceptable thermal boundary conditions. Exceeding the upper limit of counter 304 represents reaching this upper thermal limit and turns power amplifier 202 off. The maximum allowable ON-time may be based upon the thermal limits of VI instrument 200 and/or power amplifier 202.

In some embodiments, a "credit" (i.e., unused On-time) may be provided for subsequent pulsing whenever current is not actually being drawn. In this way, VI instrument 200 may provide a digital approximation of the thermal profile of power amplifier 202 where actual current usage is being monitored. This credit system may lead to a required OFF-time that is lower than the specified OFF-time resulting in shorter test times.

In some embodiments, when VI instrument 200 is used to source currents greater than the maximum allowed for continuous operation, the current may be pulsed. The maximum ON-times may depend upon the level of current being forced as well as any rail settings that have been implemented. Power supply voltage rails for VI instrument 200 may be configured to a region and set automatically using software. The term "region", as used herein, may be set by both the DUT current and the voltage dropped across the current carrying side of power amplifier 202. The pulses may be controlled by explicitly gating ON and OFF VI instrument 200. The available ON time and duty cycle combinations may be derived from the maximum heat dissipation of power amplifier 202. If the maximum is exceeded, VI instrument 100 may enter a thermal shutdown. Again, the ON-time refers to the amount of time that current is being forced to the DUT, not necessarily the amount of time that power amplifier 202 is gated ON. In some embodiments, the thermal limit control circuitry 222

As discussed above, in some embodiments, VI instrument 200 may operate in an automatic mode. The automatic mode of VI instrument 200 may use the ΔV range of 0V<ΔV≦1.8V of Table 3 for pulsed current capability and may provide the ON-times shown above.

In the event that power amplifier 202 is not ON for the maximum allowed time, it has not reached the maximum temperature it can withstand. Thus, if power amplifier 202 is turned ON for less than the maximum ON time given in Table 3, the ON time not used, out of the maximum allowable ON time, may be available for use in a later test. In other words, the ON time not used may be available as a "credit." The term "credit" as used herein refers to a difference between an actual ON-time of power amplifier 202 and maximum allowable ON-time of power amplifier 202.

Figure 5:
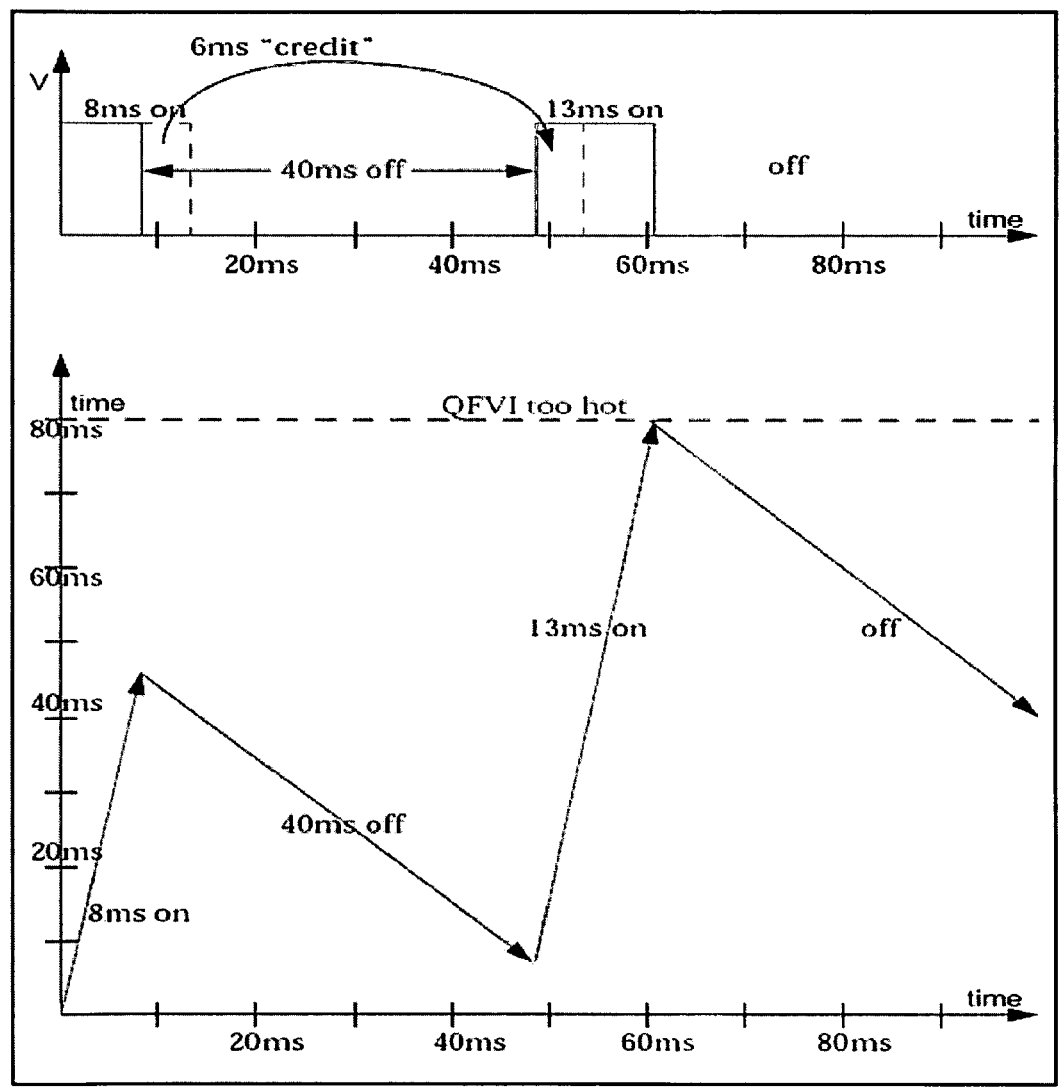
FIG. 5 is a diagram showing the application of available credit to a duty cycle in accordance with an embodiment of the present disclosure.

For example, if the maximum ON time is 14 ms and minimum OFF time is 80 ms, and if a pulse is generated for 8 ms, another pulse up to 6 ms (i.e., 14 ms-8 ms) may be generated without having to incur any cool-down waiting time. FIG. 5 illustrates this example and is described in further detail below.

Any time that VI instrument 200 spends gated OFF or at zero current between the pulses increases the available pulse width (i.e., credit), proportionally, up to the maximum allowable ON time. To continue the example, gating off and cooling down for 40 ms would recover 50% of the maximum pulse width. So after heating up by generating the 8 ms pulse, a wait of 40 ms gated off would allow one to generate another pulse of up to 13 ms: max_next_pulse=max_pulse-prior_pulse+ max_pulse*(off_time/full_off_time) or 13 ms=14 ms−8 ms+14 ms*(40 ms/80 ms). No pulse may exceed the maximum allowable ON time. The heat-up ON time may be drawn at a slope of off_time/max_pulse, and the cool-down off time as a slope of −1. When the line on the graph reaches the Max ON time, the instrument may not heat up any more or supply any more current without a current OFF cool-down. In FIG. 5, the slope during cooling time off is −1, and the slope during heating time on is 14 ms/80 ms=5.71.

Figure 6:
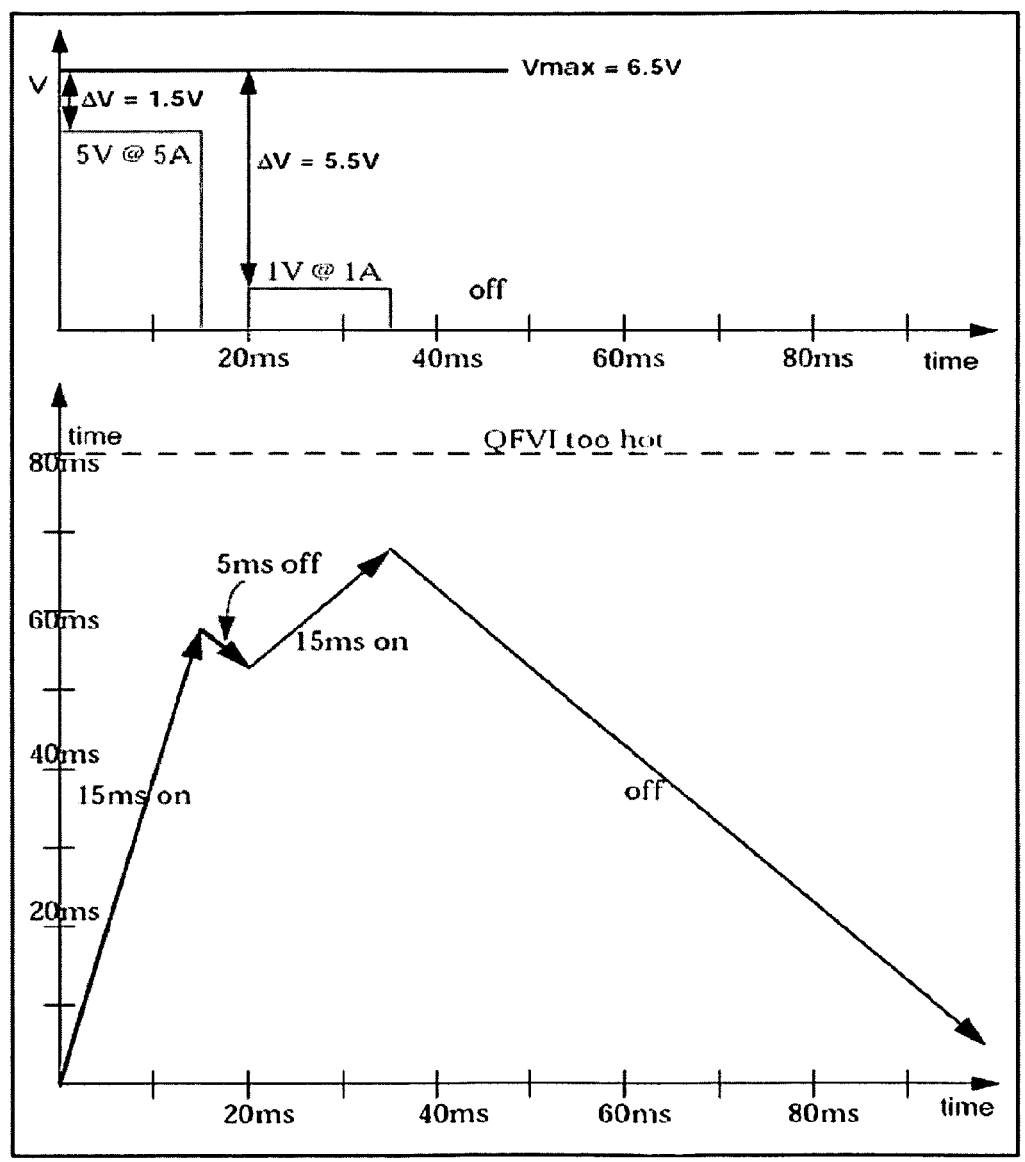
FIG. 6 is a diagram showing the results of a test for current limit and $R_{DSON}$ in accordance with an embodiment of the present disclosure.

Referring now to FIG. 6, a graphical representation depicting a DUT undergoing multiple testing procedures is shown. In this example, DUT 204 may require a test for current limit as well as a test for $R_{DSon}$. $R_{DSon}$, as used herein, refers to the resistance between the drain and source of a transistor when gated ON. For the current limit test, a current (e.g., 10 A) may be sourced into DUT 204, which is intended to increase the drain-source voltage (e.g., 5V) enough to limit the current. The voltage clamps have to be set high enough so that a failing device will show too large a voltage across it. To be able to supply 10 A, two channels may be operated simultaneously in parallel. For the test of $R_{DSon}$, the test may require forcing a current (e.g., 2 A) into the device and measuring the voltage. For this device, the typical voltage measured may be less than 1V. Of course, these I and V values are shown merely for exemplary purposes. Any current or voltage values may be used in accordance with any of the embodiments described herein.

In order to accommodate both tests, the voltage clamp settings required for the current limit test are used, and in this case the voltage clamps may be set to a maximum of 6.5V and a minimum of 0V. For the current limit test, each of the channels may force 5 A, at a voltage determined by DUT 204 (e.g., 5V). With the voltage clamp set to 6.5V, the voltage delta between the clamp and the source output is 6.5V–5V=1.5V. This configuration has VI instrument 200 operating in a region of pulses of 20 ms on maximum and 80 ms off minimum.

For the test of $R_{DSon}$, each of the two channels forces 1 A, at a voltage determined by DUT 204 but nominally near 1V. With the voltage clamp set to 6.5V, the voltage delta between the clamp and the source output is 6.5V–1V=5.5V. From Table 3, this has VI instrument 200 operating in a region of pulses of 80 ms on maximum and 80 ms off minimum.

In this example, both tests may be run in a continuous sequence. The current pulses may remain on long enough to allow for stabilization and for any measurements to be recorded (e.g., 15 ms each). VI instrument 200 may be gated off for approximately 5 ms between tests to change current ranges.

FIG. 6 shows the slope for both the first test (80 ms/20 ms=4) and the second test (80 ms/80 ms=1). In order to completely cool off the channels, the current must be turned off for (4*15 ms)–5 ms+(1*15 ms) or approximately 70 ms.

In some embodiments, a credit balance inquiry statement may be provided. The credit balance inquiry statement may provide a programmer with added visibility into the remaining thermal capacity of the VI instrument. This may allow the use of program control statements for test sequencing. This indication of an available ON-time may be given on request to the user and may be displayed using a variety of different techniques, including, but not limited to, light emitting diodes (LEDs), digital displays, etc. As such, programmers may increase the efficiency of their test programs by knowing the amount of credit available and sequencing their test programs to minimize wait states, thus increasing test efficiency. The software command may allow the counter value to be read and enable the use of programmatic conditional statements such as If/Then/Else.

While the majority of the discussion contained herein is in the context of disabling power amplifier 202 if the maximum allowable ON-time is exceeded, it should be noted that thermal limit control circuitry 222 may also be used to disable power amplifier 202 if the current and/or voltage is too low. For example, rechargeable battery life may be negatively effected if a particular battery is drained excessively too many times. In some cases, the amount of current being drawn may be measured and the unit being powered may be disabled if the battery power is too low, thus preventing it from being discharged excessively. The methods and voltage/current measuring capabilities of the present disclosure may be easily applied to these applications as well. Moreover, in some embodiments, the counter values provided by counter 304 may be used to signify the amount of time left in a particular battery's life.

Any or all of the embodiments described above may be implemented in a computer program that may be stored on a storage medium having instructions to program a system to perform the methods. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

Advantageously, the embodiments described herein provide a number advantages over the prior art. For example, by determining a more accurate representation of the thermal profile of the VI instrument the effective duty cycle of the power amplifier may be increased as the number of forced wait states may be minimized. Moreover, the temperature approximating system described herein counts up only when current is being supplied, not merely when there is a Gate ON command. The incorporation of the credit balance inquiry statement allows a programmer visibility into the remaining thermal capability of the power amplifier of VI instrument and may allow for program control statements for test sequencing.

It should be noted that the embodiments described herein may be used in accordance with a number of applications, in addition to the testing system description provided herein. For example, this disclosure may be applied to power control systems that may use a pulse width modulated (PWM) output. Numerous other applications are also envisioned.

Figure 7:
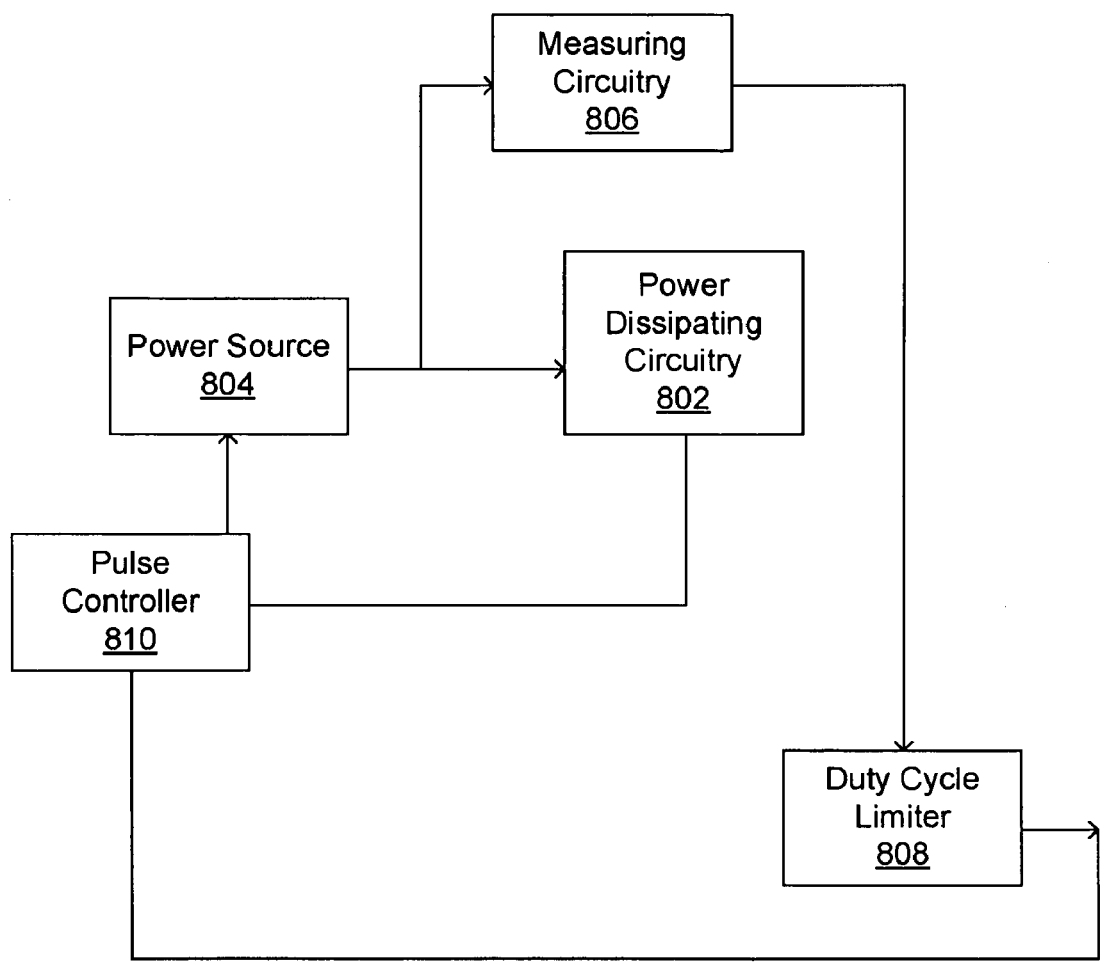
FIG. 7 is a diagram showing a pulsing system in accordance with an embodiment of the present disclosure.
Figure 8:
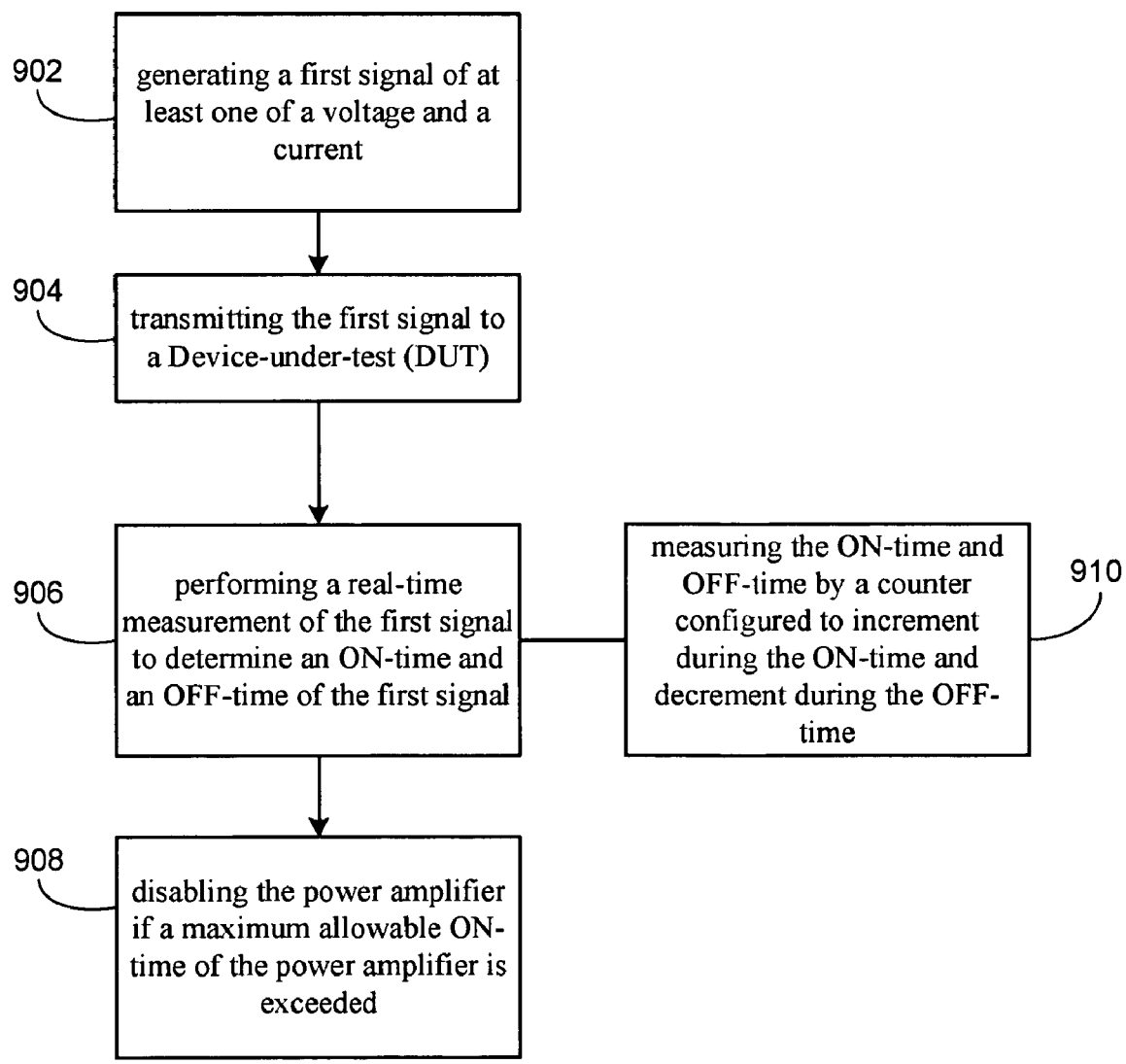
FIG. 8 is a flowchart in accordance with an embodiment of the present disclosure.

In this way, the methods described herein are not limited to testing instruments and may be used in any pulsing system. FIG. 7 provides a block diagram of one particular embodiment of a pulsing system in accordance with the present disclosure. Pulsing system 800 may include a power dissipating element 802 configured to receive power from a power source 804. Power source 804 and/or power dissipating element 802 may be configured to generate a first signal. Pulsing system 800 may also include at least one measuring instrument 806, which may be in communication with power source 804 as well as duty cycle limiter 808. Measuring instrument 806 may be configured to measure the first signal and to provide an input corresponding to the measured signal to duty cycle limiter 808. Pulsing system 800 may further include a pulse controller 810 coupled to power source 804. In some cases, pulse controller 810 may be configured to control the duty cycle of the first signal. Pulse controller 810 may be further configured to receive a second signal from duty cycle limiter 808 and to disable power source 804 and/or power dissipating element 802 if duty cycle limiter 808 determines that a maximum condition has been exceeded. The maximum condition may correspond to a maximum allowable ON-time and/or a maximum allowable duty cycle.

It should be noted that the pulsing system described herein may be configured to generate either a variable or fixed pulsing operation. Other possible applications of the present disclosure may include, but are not limited to, power tools, power semiconductor device tester applications, hybrid electric car motors, laser drilling devices, car horns/annunciators, servo motor control systems, paint sprayers, etc. For example, a fixed pulsing operation may be employed to perform a fault protection operation.

A number of embodiments have been described. Nevertheless, it will be understood that various modifications may be made. Accordingly, other embodiments are within the scope of the following claims.

What is claimed is:

1. A testing system comprising:
a voltage/current (VI) instrument including a power amplifier configured to generate a first signal of at least one of a voltage and a current, said VI instrument further configured to transmit said first signal to a device-under-test (DUT) and to perform a real-time measurement of said first signal to determine an ON-time and an OFF-time of said first signal, said VI instrument further configured to disable said power amplifier if a maximum allowable ON-time of said power amplifier is exceeded.

2. The testing system of claim 1 wherein said ON-time and OFF-time is measured by a counter, said counter configured to increment during said ON-time and decrement during said OFF-time.

3. The testing system of claim 1 wherein said VI instrument is further configured to disable said power amplifier if a maximum allowable ON-time to OFF-time duty cycle of said power amplifier is exceeded.

4. The testing system of claim 1 wherein at least one of said maximum allowable ON-time and a maximum allowable ON-time to OFF-time duty cycle of said power amplifier is adjusted in real-time.

5. The testing system of claim 1 wherein said VI instrument is further configured to provide an indication of an available ON-time before said maximum allowable ON-time is reached.

6. The testing system of claim 1 wherein said VI instrument is further configured to change said maximum allowable ON-time and a maximum allowable ON-time to OFF time duty cycle in response to at least one of a measured voltage and a measured current.

7. The testing system of claim 1 wherein said VI instrument is further configured to allow said power amplifier to be re-enabled from a disabled state and to apply at least one of said maximum allowable ON-time and a maximum allowable ON-time to OFF-time duty cycle.

8. A method for analyzing a voltage/current (VI) instrument comprising:
generating a first signal of at least one of a voltage and a current;
transmitting said first signal to a device-under-test (DUT);
performing a real-time measurement of said first signal to determine an ON-time and an OFF-time of said first signal; and
disabling said power amplifier if a maximum allowable ON-time of said power amplifier is exceeded.

9. The method of claim 8 further comprising measuring said ON-time and OFF-time by a counter, said counter configured to increment during said ON-time and decrement during said OFF-time.

10. The method of claim 8 further comprising disabling said power amplifier if a maximum allowable ON-time to OFF-time duty cycle of said power amplifier is exceeded.

11. The method of claim 8 further comprising adjusting, in real-time, at least one of said maximum allowable ON-time and a maximum allowable ON-time to OFF-time duty cycle of said power amplifier.

12. The method of claim 8 further comprising providing an indication of an available ON-time before said maximum allowable ON-time is reached.

13. The method of claim 8 further comprising changing said maximum allowable ON-time and a maximum allowable ON-time to OFF time duty cycle in response to at least one of a measured voltage and a measured current.

14. The method of claim 8 further comprising allowing said power amplifier to be re-enabled from a disabled state and to apply at least one of said maximum allowable ON-time and a maximum allowable ON-time to OFF-time duty cycle.

15. A pulsing system comprising:
a power dissipating element configured to receive power from a power source, at least one of said power source and said power dissipating element configured to generate a first signal;
at least one measuring instrument in communication with said at least one power source, said at least one measuring instrument configured to measure said first signal and to provide an input corresponding to a measured signal to a duty cycle limiter; and
a pulse controller operatively connected to said at least one power source, said pulse controller configured to control a duty cycle of said first signal, said pulse controller further configured to receive a second signal from said duty cycle limiter and to disable at least one of said power source and said power dissipating element if said duty cycle limiter has determined that a maximum condition has been exceeded.

16. The pulsing system of claim 15 wherein said pulse controller generates a variable pulsing operation.

17. The pulsing system of claim 16 wherein said pulsing system is associated with a device selected from the group consisting of a power tool and a power semiconductor device tester.

18. The pulsing system of claim 15 wherein said pulse controller generates a fixed pulsing operation.

19. The pulsing system of claim 18 wherein said pulsing system is associated with a fault protection function.

20. The pulsing system of claim 15 wherein said maximum condition is at least one of a maximum allowable ON-time and a maximum allowable duty cycle.

* * * * *